United States Patent
Im et al.

(10) Patent No.: US 9,666,433 B2
(45) Date of Patent: May 30, 2017

(54) METHODS FOR MANUFACTURING A SEMICONDUCTOR DEVICE

(71) Applicant: SAMSUNG ELECTRONICS CO., LTD., Suwon-si, Gyeonggi-do (KR)

(72) Inventors: Badro Im, Yongin-si (KR); Yoonchul Cho, Suwon-si (KR); Sangyeol Kang, Suwon-si (KR); Daehyun Kim, Suwon-si (KR); Dongkak Lee, Yongin-si (KR); Jun-Noh Lee, Hwaseong-si (KR); Bonghyun Kim, Incheon (KR); Kongsoo Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/130,515

(22) Filed: Apr. 15, 2016

(65) Prior Publication Data

US 2016/0351408 A1    Dec. 1, 2016

(30) Foreign Application Priority Data

May 27, 2015 (KR) .................. 10-2015-0074125

(51) Int. Cl.
| | |
|---|---|
| *H01L 21/311* | (2006.01) |
| *H01L 21/033* | (2006.01) |
| *H01L 21/308* | (2006.01) |
| *H01L 21/3105* | (2006.01) |
| *H01L 21/3213* | (2006.01) |

(Continued)

(52) U.S. Cl.
CPC ...... *H01L 21/0337* (2013.01); *H01L 21/3086* (2013.01); *H01L 21/3105* (2013.01); *H01L 21/31058* (2013.01); *H01L 21/31122* (2013.01); *H01L 21/31138* (2013.01); *H01L 21/31144* (2013.01); *H01L 21/32139* (2013.01); *H01L 21/0228* (2013.01); *H01L 21/02112* (2013.01);

(Continued)

(58) Field of Classification Search
CPC .......... H01L 21/31144; H01L 21/0337; H01L 21/32139; H01L 21/02274; H01L 21/3086; H01L 21/31138; H01L 21/0228; H01L 21/31122; H01L 21/3146; H01L 21/3105; H01L 21/02527; H01L 21/31058; H01L 21/32055; H01L 21/02112
USPC .................................. 438/942, 703
See application file for complete search history.

(56) References Cited

U.S. PATENT DOCUMENTS

| | | | |
|---|---|---|---|
| 7,115,525 B2 | 10/2006 | Abatchev et al. | |
| 7,208,405 B2 * | 4/2007 | Owada | H01L 21/76807 257/760 |

(Continued)

FOREIGN PATENT DOCUMENTS

| | | |
|---|---|---|
| JP | 3214931 B2 | 7/2001 |
| KR | 10-2009-0045754 A | 5/2009 |

(Continued)

*Primary Examiner* — Thien F Tran
(74) *Attorney, Agent, or Firm* — Volentine & Whitt, PLLC

(57) ABSTRACT

Carbon-containing patterns are formed on an etch target layer, side surfaces of the carbon-containing patterns are treated by a hydrophilic process, poly-crystalline silicon spacers are formed on the side surfaces of the carbon-containing patterns after the hydrophilic process has been performed, and the etch target layer is patterned using the poly-crystalline silicon spacers as an etch mask.

20 Claims, 18 Drawing Sheets

(51) Int. Cl.
   *H01L 21/02*       (2006.01)
   *H01L 21/3205*     (2006.01)
(52) U.S. Cl.
   CPC .. *H01L 21/02129* (2013.01); *H01L 21/02274* (2013.01); *H01L 21/32055* (2013.01)

(56) References Cited

U.S. PATENT DOCUMENTS

| | | |
|---|---|---|
| 7,494,934 B2 | 2/2009 | Bai |
| 7,709,396 B2 | 5/2010 | Bencher et al. |
| 2009/0269924 A1* | 10/2009 | Choi .................. H01L 21/0337 438/669 |
| 2014/0057419 A1 | 2/2014 | Tian et al. |
| 2014/0141579 A1 | 5/2014 | Tian et al. |

FOREIGN PATENT DOCUMENTS

| | | |
|---|---|---|
| KR | 10-0945928 B1 | 2/2010 |
| KR | 10-2011-0091216 A | 8/2011 |
| KR | 10-2013-0023806 A | 3/2013 |

\* cited by examiner

METHODS FOR MANUFACTURING A SEMICONDUCTOR DEVICE

PRIORITY STATEMENT

This U.S. non-provisional patent application claims priority under 35 U.S.C. §119 to Korean Patent Application No. 10-2015-0074125, filed on May 27, 2015, in the Korean Intellectual Property Office, the disclosure of which is hereby incorporated by reference in its entirety.

BACKGROUND

The inventive concepts relate to semiconductor devices and methods for manufacturing the same. More particularly, the inventive concepts relate to the forming of fine patterns in methods of forming semiconductor devices.

Semiconductor devices are widely used in the electronics industry because of their small sizes, multi-functional characteristics and/or low manufacture costs. Semiconductor devices may be categorized as any one of semiconductor memory devices configured to store data, semiconductor logic devices configured to process data, and hybrid semiconductor devices having both the function of a semiconductor memory device and the function of a semiconductor logic device. As the electronic industry continues to develop, semiconductor devices with improved characteristics are increasingly in demand. For example, highly-reliable, high-speed and/or multi-functional semiconductor devices are increasingly in demand. To satisfy these demands, structures of semiconductor devices must become more complex and highly integrated.

One way to increase the integration of semiconductor devices is to develop techniques that allow for the patterns of semiconductor devices, e.g., circuit patterns, to become finer. However, as these techniques become more complex the costs incurred in manufacturing the semiconductor devices tends to increase accordingly.

SUMMARY

According to one aspect of the inventive concepts, there is provided a method of manufacturing a semiconductor device which includes forming carbon-containing patterns on an etch target, increasing a degree to which side surfaces of the carbon-containing patterns are hydrophilic by treating the carbon-containing patterns with a hydrophilic-enhancing process, forming poly-crystalline silicon spacers on the side surfaces of the carbon-containing patterns after the hydrophilic-enhancing process, and patterning the etch target using the poly-crystalline silicon spacers.

According to another aspect of the inventive concepts, there is provided a method of manufacturing a semiconductor device which includes sequentially forming a carbon-containing layer and a silicon-containing layer on an etch target layer, etching the carbon-containing layer using the silicon-containing layer as an etch mask to form carbon-containing patterns, forming poly-crystalline silicon spacers on side surfaces of the carbon-containing patterns, and patterning the etch target layer using the poly-crystalline silicon spacers. Etching the carbon-containing layer may be performed using an oxygen plasma. Silicon atoms in the silicon-containing layer may be combined with oxygen atoms in the oxygen plasma to form an oxide layer on the side surfaces of the carbon-containing patterns while the carbon-containing layer is etched.

According to still another aspect of the inventive concepts, there is provided a method of manufacturing a semiconductor device which includes forming carbon-containing patterns on an etch target, the carbon-containing patterns having top surfaces and side surfaces, providing second material, that is more hydrophilic than first material constituting the side surfaces of the carbon-containing patterns terminate, along the side surfaces of the carbon-containing patterns so that the side surfaces become more hydrophilic, forming poly-crystalline silicon spacers on the side surfaces of the carbon-containing patterns provided with the second material, and patterning the etch target layer using the poly-crystalline silicon spacers.

According to yet another aspect of the inventive concepts, there is provided a method of manufacturing a semiconductor device which includes supplying a substrate having carbon-containing patterns into a process chamber, sequentially forming an oxide layer and a poly-crystalline silicon layer on the carbon-containing patterns, and patterning a portion of the substrate using the poly-crystalline silicon layer. The oxide layer and the poly-crystalline silicon layer are sequentially formed in the same process chamber.

According to yet another aspect of the inventive concepts, there is provided a method of manufacturing a semiconductor device which includes forming on an etch target a series of spaced apart carbon-containing patterns having side surfaces, forming insulating material of at least one element and/or at least one compound selected from the group consisting of O, ON, OH, N and NH at the side surfaces of the carbon-containing patterns, forming a mask, and etching the etch target using the mask as an etch mask, and in which the forming of the mask comprises forming polycrystalline silicon on the insulating material including by a process in which atoms of silicon are deposited directly on the insulating material, and removing the carbon-containing patterns after the polycrystalline silicon has been formed on the insulating material.

BRIEF DESCRIPTION OF THE DRAWINGS

The inventive concepts will become more apparent from the detailed description that follows as made with reference to the accompanying drawings.

DETAILED DESCRIPTION

Figure 1:
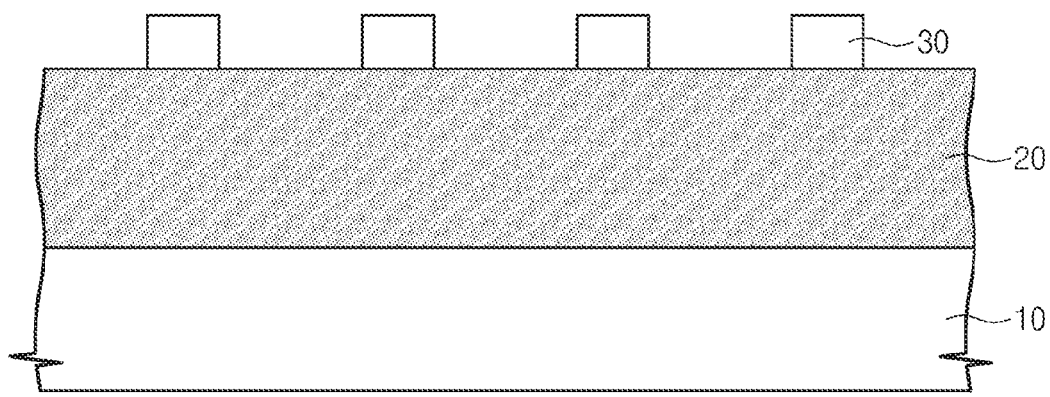
FIGS. 1, 2, 3 and 4 are cross-sectional views of a semiconductor device during the course of its manufacture and together illustrate a method of manufacturing a semiconductor device according to the inventive concepts.

Examples of realizing the inventive concepts will now be described more fully hereinafter with reference to the accompanying drawings. The advantages and features of the inventive concepts and methods of achieving them will be apparent from the following detailed description of these examples as made with reference to the accompanying drawings. It should be noted, however, that the inventive concepts are not limited to the following examples, and may be implemented in various forms. Accordingly, the examples are provided only to disclose the inventive concepts to those skilled in the art. In the drawings, various features of the inventive concepts are not limited to the specific examples shown therein and may be exaggerated for clarity. The same reference numerals or the same reference designators denote the same elements throughout the specification.

It will be understood that when an element such as a layer (e.g., a conductive layer, a semiconductor layer or an insulating layer), region or substrate is referred to as being "on" another element, it can be directly on the other element or intervening elements may be present. It will be also understood that although the terms first, second, third etc. may be used herein to describe various elements, these elements should not be limited by these terms. These terms are only used to distinguish one element from another element. Thus, a first element in some examples could be termed a second element in other examples without departing from the teachings of the present invention.

The terminology used herein is for the purpose of describing particular examples only and is not intended to limit the inventive concepts. As used herein, the singular terms "a," an and the are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the sectional views and/or plan views may show idealized forms of the inventive concepts. In the drawings, the thicknesses of layers and regions may be exaggerated for clarity. Accordingly, shapes of features of the examples may be modified according to manufacturing techniques and/or allowable errors. Therefore, the inventive concepts are not limited to the specific shapes illustrated in the exemplary views, but may include other shapes that may be created according to manufacturing processes. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the inventive concepts.

FIGS. 1 to 4 illustrate a method of manufacturing a semiconductor device according to the inventive concepts.

Referring to FIG. 1, a carbon-containing layer 20 may be formed on an etch target layer 10. The etch target layer 10 may be a portion of a substrate or an additional layer formed on a substrate. For example, if the etch target layer 10 is a portion of a substrate, the substrate may be a semiconductor substrate including silicon, silicon-germanium, or germanium. Alternatively, the substrate may be an insulating substrate or a conductive substrate. If the etch target layer 10 is an additional layer formed on a substrate, the etch target layer 10 may be an insulating layer including at least one of silicon oxide, silicon oxynitride and silicon nitride or may be a layer including a metal or a semiconductor material. The carbon-containing layer 20 may have a carbon content of about 70 wt % or more. For example, the carbon-containing layer 20 may include at least one of an amorphous carbon layer (ACL) or a carbon-spin on hardmask (C—SOH) layer. If the carbon-containing layer 20 is an amorphous carbon layer, the carbon-containing layer 20 may be formed by a chemical vapor deposition (CVD) process. If the carbon-containing layer 20 is a C—SOH layer, the carbon-containing layer 20 may be formed by a spin-coating process and a bake process. In one example, a binder forming the carbon-containing layer 20 may include a polymer that has a high carbon-content and a molecular weight of about 10,000. A carbon content of the C—SOH layer may range from about 70 wt % to about 95 wt %.

Mask patterns 30 may be formed on the carbon-containing layer 20. The mask patterns 30 may have line shapes or bar shapes in a plan view. In one example, the mask patterns 30 having the line or bar shapes may be spaced apart from each other and may be arranged at equal distances. However, the inventive concepts are not limited thereto. The distances and shapes of the mask patterns 30 may be controlled as desired.

A mask layer may be formed on the carbon-containing layer 20, and photoresist patterns may be formed on the mask layer. The mask layer may be etched using the photoresist patterns as an etch mask to form the mask patterns 30. The mask layer may be a silicon-containing layer. For example, the mask layer may include $SiO_2$, SiON, $SiN_2$, SiBN or SiCN and may be formed by a CVD process. Alternatively, the mask layer may include a silicon-spin on hardmask (Si—SOH) layer. The Si—SOH layer may be formed by a spin-coating process and a bake process. The Si—SOH may be synthesized by a condensation reaction using several silicon monomers. In this case, physical properties of the Si—SOH layer may be controlled by controlling an organic substitution group of the monomer. A silicon content of the Si—SOH layer may range from about 15 wt % to about 45 wt %. The Si—SOH layer may be thermally hardened by the bake process.

Before a photoresist layer is formed on the mask layer, a bottom anti-reflective coating layer (BARC) may be formed between the mask layer and the photoresist layer. For example, the bottom anti-reflective coating layer may absorb light for irradiating the photoresist layer during an exposure process, thereby preventing an undesired reflection and scattering of the light which could cause the form of the resulting photoresist patterns to deviate from their desired form. Alternatively, the bottom anti-reflective coating layer is not provided. In one example, the Si—SOH layer may act as the bottom anti-reflective coating layer.

Etching the mask layer using the photoresist patterns as the etch mask may be performed using a plasma etching process. For example, the etching process of the mask layer may be a dry etching process using halogen plasma. For example, the halogen-plasma etching process may be performed using fluoromethane.

Figure 2:
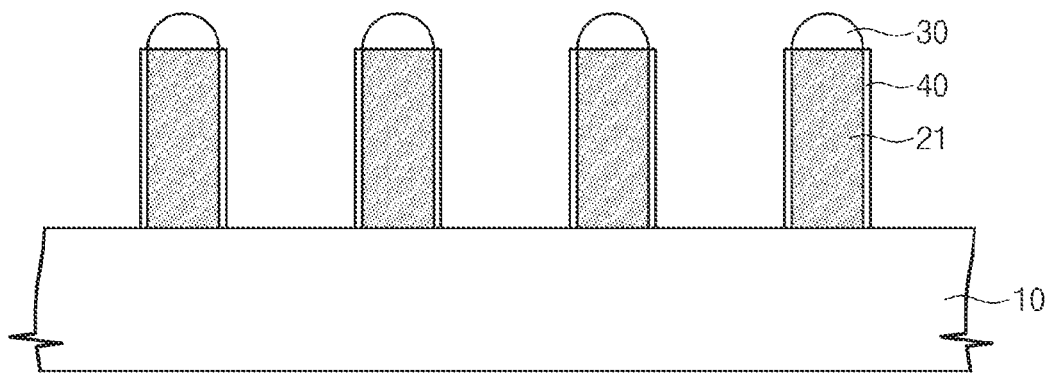

Referring to FIG. 2, carbon-containing patterns 21 may be formed from the carbon-containing layer 20 by an etching process using the mask patterns 30 as an etch mask. For example, the etching process may be a dry etching process using oxygen ($O_2$) plasma. At least a portion of the mask patterns 30 may be etched by the etching process, so the mask patterns 30 may have rounded top surfaces as illustrated in FIG. 2.

A hydrophilic process may be performed on side surfaces of the carbon-containing patterns 21. A hydrophilic material 40 may be formed on the side surfaces of the carbon-containing patterns 21 by the hydrophilic process. For example, the hydrophilic material 40 may be an insulating material including at least one of O, ON, OH, N, or NH. In one example, the hydrophilic material 40 may be an oxide, more particularly, silicon oxide. Alternatively, the hydrophilic material 40 may be boron oxide.

The carbon-containing patterns 21 may include hydrophobic atoms such as carbon or hydrogen. In other words, the surface and, in particular, the side surfaces, of each of the carbon-containing patterns 21 may terminate with carbon or hydrogen. In this case, if poly-crystalline silicon spacers to be described below were to be formed on the side surfaces of the carbon-containing patterns 21 without the hydrophilic process according to the inventive concepts, a source for the formation of the poly-crystalline silicon spacers would not be uniformly deposited on the side surfaces of the carbon-containing patterns 21 but would be locally deposited on the side surfaces of the carbon-containing patterns 21, thereby causing non-uniform formation of the poly-crystalline silicon spacers. The hydrophilic process according to the inventive concepts will be described in more detail with reference to FIGS. 5 to 14.

Figure 3:
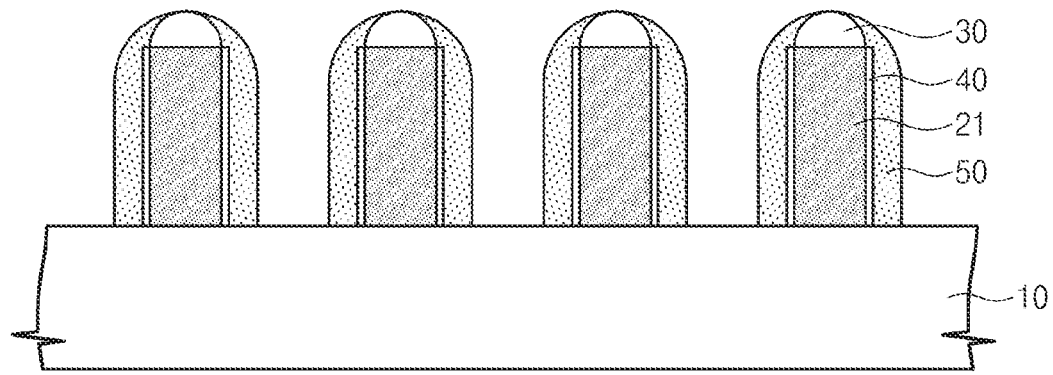

Referring to FIG. 3, poly-crystalline silicon spacers 50 may be formed on the side surfaces of the carbon-containing patterns 21 which are treated by the hydrophilic process. For example, a poly-crystalline silicon layer may be formed on the carbon-containing patterns 21 and the etching target layer 10, and an anisotropic etching process may be performed on the poly-crystalline silicon layer to form the poly-crystalline silicon spacers 50. The poly-crystalline silicon layer may be formed at a low temperature of about 400 degrees Celsius or less. If the poly-crystalline silicon layer were formed at a temperature higher than 400 degrees Celsius, carbon included in the carbon-containing patterns 21 would react with oxygen so as to be converted into CO or $CO_2$, and the CO or $CO_2$ would be removed from the carbon-containing patterns 21. This phenomenon could cause a loss of the carbon-containing patterns 21, so much so the etch target layer 10 would be incompletely or non-uniformly patterned. To deposit the poly-crystalline silicon layer at the relatively low temperature, a boron source as well as a silicon source may be added during the deposition process. For example, the silicon source may include silane and the boron source may include $B_2H_6$. Boron (B) of the boron source may act as a catalyst to reduce decomposition activation energy of the silane, and thus the poly-crystalline silicon layer may be formed at the relatively low temperature. As described above, seeds for the formation of the poly-crystalline silicon layer may be uniformly formed on the side surfaces of the carbon-containing patterns 21 by the hydrophilic material 40 formed by the hydrophilic process, so the poly-crystalline silicon layer may be uniformly formed on the side surfaces of the carbon-containing patterns 21.

Figure 4:
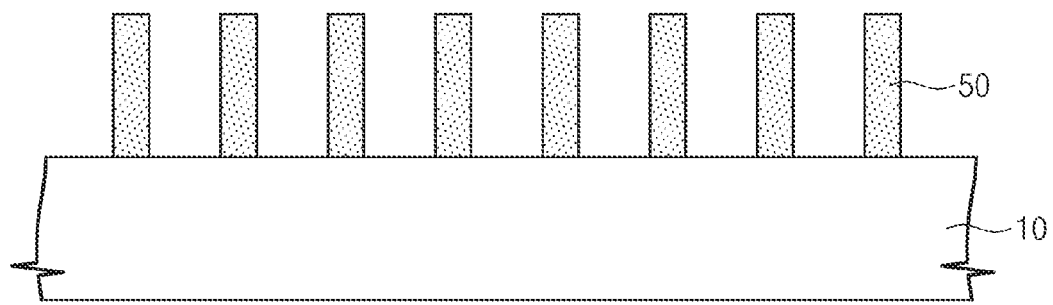

Referring to FIG. 4, the mask patterns 30 exposed by the poly-crystalline silicon spacers 50 may be removed, and then the carbon-containing patterns 21 may be removed. The removal of the mask patterns 30 may be performed using a dry etching process. The carbon-containing patterns 21 may be removed by an ashing process using oxygen. Portions of upper portions of the carbon-containing patterns 21 may be removed by the processes of removing the mask patterns 30 and the carbon-containing patterns 21. The hydrophilic material 40 may also be removed by the processes of removing the mask patterns 30 and the carbon-containing patterns 21. Alternatively, the hydrophilic material 40 may remain. Subsequently, the etch target layer 10 may be patterned using the poly-crystalline silicon spacers 50. The patterning process of the etch target layer 10 will be described later in more detail with reference to FIGS. 15 to 21.

Figure 5:
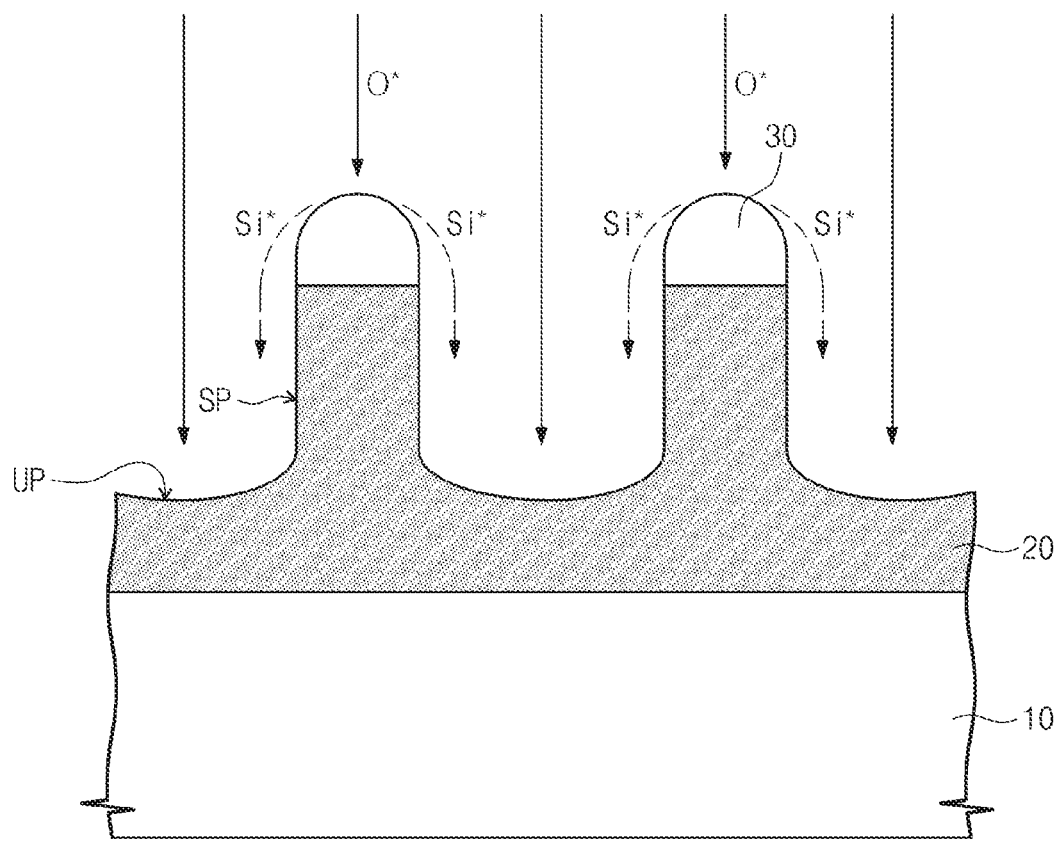
FIGS. 5 and 6 are cross-sectional views of a semiconductor device during the course of its manufacture and together illustrate a hydrophilic process according to the inventive concepts.
Figure 6:
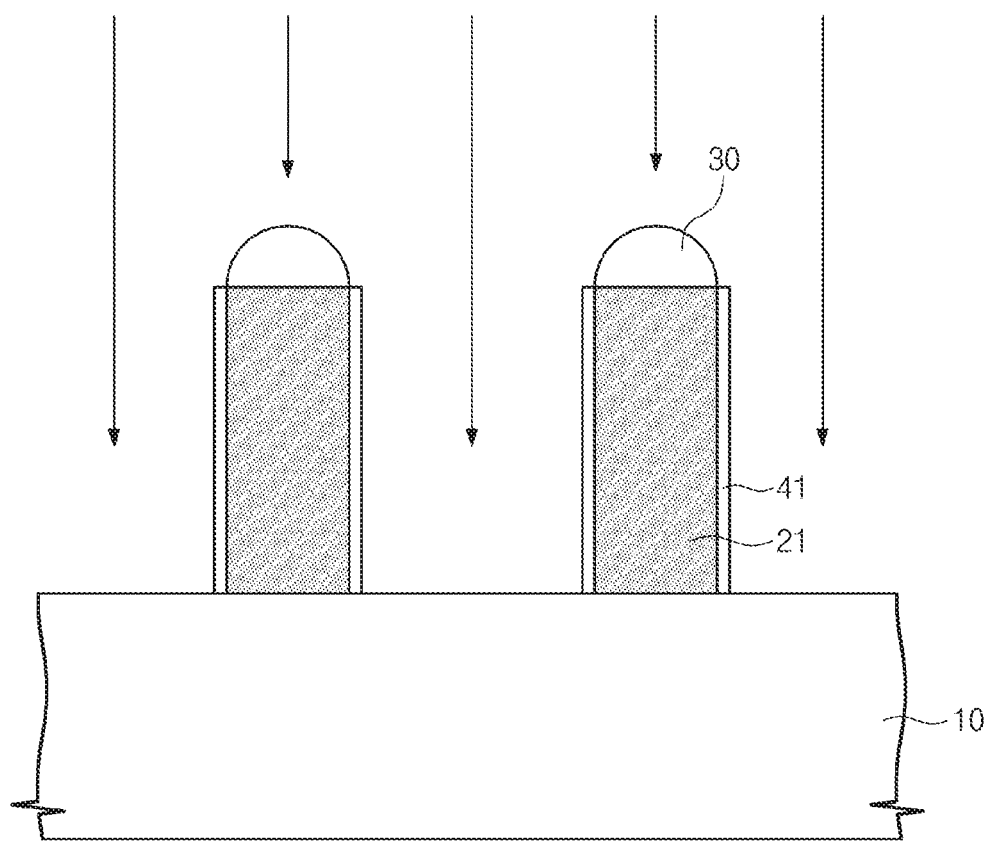

FIGS. 5 and 6 are cross-sectional views illustrating a hydrophilic process according to the inventive concepts. That is, a more detailed example of the hydrophilic process shown in FIG. 2 will be described with reference to FIGS. 5 and 6.

The etching process of the carbon-containing layer 20 may be performed using the mask patterns 30 as an etch mask. The etching process may be a dry etching process using oxygen ($O_2$) plasma. Oxygen radicals O* formed by a radio frequency (RF) source may be provided to exposed top surfaces of the mask patterns 30 and an exposed top surface of the carbon-containing layer 20. The oxygen radicals O* may be forced to travel linearly, perpendicular to an upper surface of the substrate 10, by an RF bias. The carbon content of the carbon-containing layer 20 may be higher than that of the mask patterns 30. The carbon of the carbon-containing layer 20 combines more easily with the oxygen radicals O* than do elements (e.g., silicon or nitrogen) of the mask patterns 30. The carbon of the carbon-containing layer 20 may be combined with the oxygen radicals O* to be converted into a gas (e.g., $CO_2$), so the carbon may be removed from the carbon-containing layer 20. The mask patterns 30 may protect portions of the carbon-containing layer 20 which are covered by the mask patterns 30.

The mask patterns 30 may include a silicon-containing material. For example, the mask patterns 30 may include at least one of $SiO_2$, SiON, $SiN_2$, SiBN, and SiCN or may include an Si—SOH material. Upper portions of the mask patterns 30 may be partially etched by the etching process. Since silicon radicals separated from the mask patterns 30 are heavier than carbon, the silicon radicals may not easily escape from a wafer but may react with the oxygen radicals to form silicon oxide. During the etching process, due to the directionality of the oxygen radicals O*, the formed silicon oxide which adheres to an exposed top surface UP of the carbon-containing layer 20 may be removed by the oxygen radicals but the formed silicon oxide which adheres to an exposed side surfaces SP of the carbon-containing layer 20 may remain on those surfaces SP. As a result, a hydrophilic material may be formed on side surfaces SP of carbon-containing patterns 21 formed by the etching process. The hydrophilic material may be a silicon insulating layer 41. For example, the silicon insulating layer 41 may include silicon oxide and/or silicon oxynitride.

According to an aspect of the inventive concepts, silicon in the mask patterns 30 may react with the oxygen radicals during the etching process, so the silicon insulating layer 41 may be formed on the side surfaces of the carbon-containing patterns 21 without an additional deposition process. Subsequently, the processes described with reference to FIGS. 3 and 4 may be performed.

Figure 7:
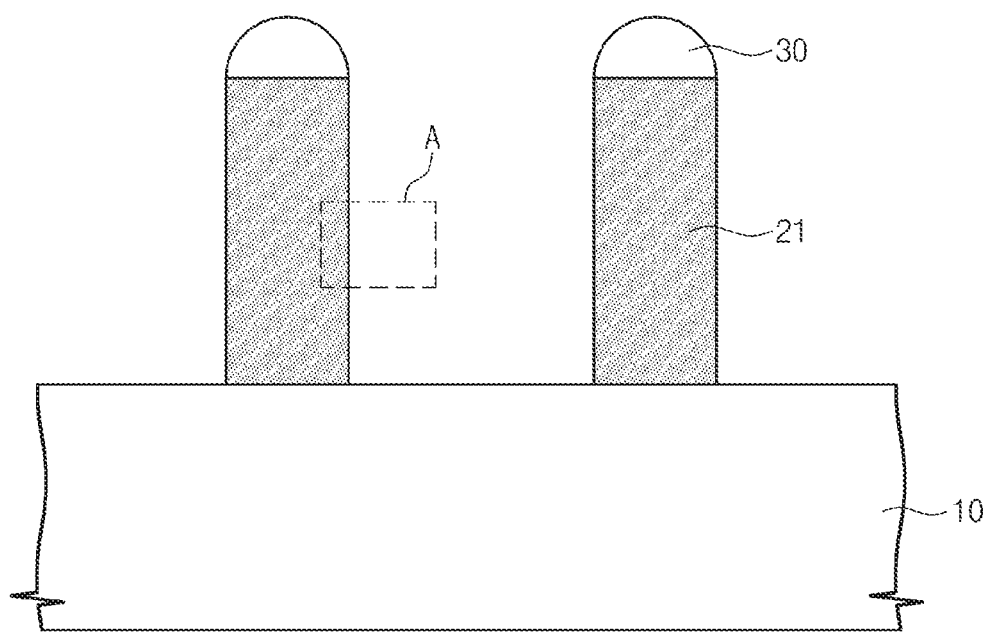
FIG. 7 is a cross-sectional view of a semiconductor device during the course of its manufacture and illustrates a hydrophilic process according to the inventive concepts.
Figure 8:
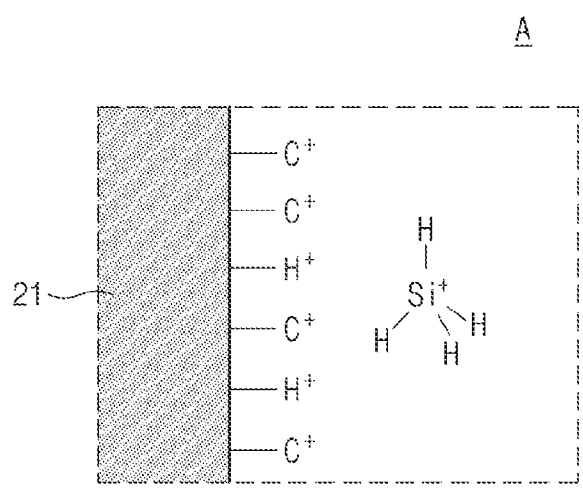
FIGS. 8 and 9 are enlarged views of portion 'A' of FIG. 7.
Figure 9:
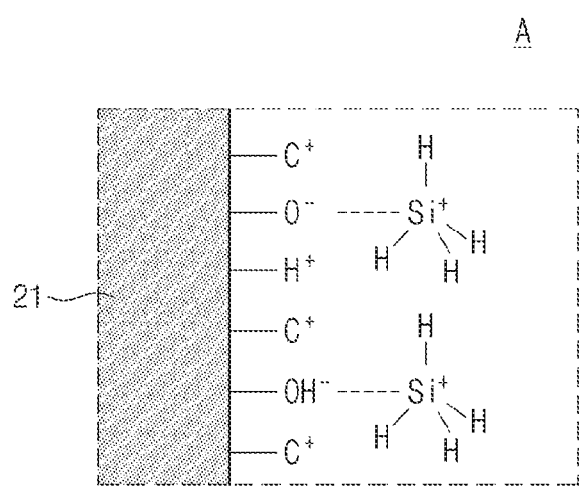

FIG. 7 is a cross-sectional view illustrating other examples of the hydrophilic process according to the inventive concepts. FIGS. 8 and 9 are enlarged views of portion 'A' of FIG. 7.

Referring to FIGS. 7 and 8, the side surfaces of the carbon-containing patterns 21 formed by the processes described with reference to FIGS. 1 and 2 may terminate with hydrophobic elements. The hydrophobic elements may include carbon and/or hydrogen. The carbon and hydrogen may have positive polarity, and the electronegativity of the carbon and hydrogen may be lower than that of hydrophilic elements. Thus, the carbon and hydrogen may have low reactivity with a silicon source (e.g., silane) for formation of poly-crystalline silicon spacers. In this case, if the poly-crystalline silicon spacers to be described later were to be formed on the side surfaces of the carbon-containing patterns 21 without the hydrophilic process according to the inventive concepts, the source for the formation of the poly-crystalline silicon spacers would not be uniformly deposited on the side surfaces of the carbon-containing patterns 21 but would be locally deposited on the side surfaces of the carbon-containing patterns 21 to cause non-uniform deposition of the material forming the poly-crystalline silicon spacers.

As illustrated in FIG. 9, at least a portion of the hydrophobic elements on the side surfaces of the carbon-containing patterns 21 may be replaced with hydrophilic elements by the hydrophilic process according to the inventive concepts. As a result, a hydrophilic material is formed on the side surfaces of the carbon-containing patterns 21. The hydrophilic elements may have negative polarity or may have electronegativity greater than that of the hydrophobic elements. The hydrophilic elements may include at least one of O, ON, OH, N, and NH. As illustrated in FIG. 9, some of the hydrophobic elements of the side surfaces of the carbon-containing patterns 21 may be replaced with $O^-$ and $OH^-$. This hydrophilic process may be performed by a wet treatment process using $O_3$ or a wet treatment process using $NH_4OH$ and $H_2O_2$. The silicon source (i.e., silicon atoms of silane) may form an ionic bond and/or a covalent bond with the hydrophilic elements, so the silicon layer may be uniformly formed on the side surfaces of the carbon-containing patterns 21.

According to this example, the silicon source may be more easily and uniformly deposited on the side surfaces of the carbon-containing patterns 21 by the wet process using the hydrophilic elements. Subsequently, the processes described with reference to FIGS. 3 and 4 may be performed.

Figure 10:
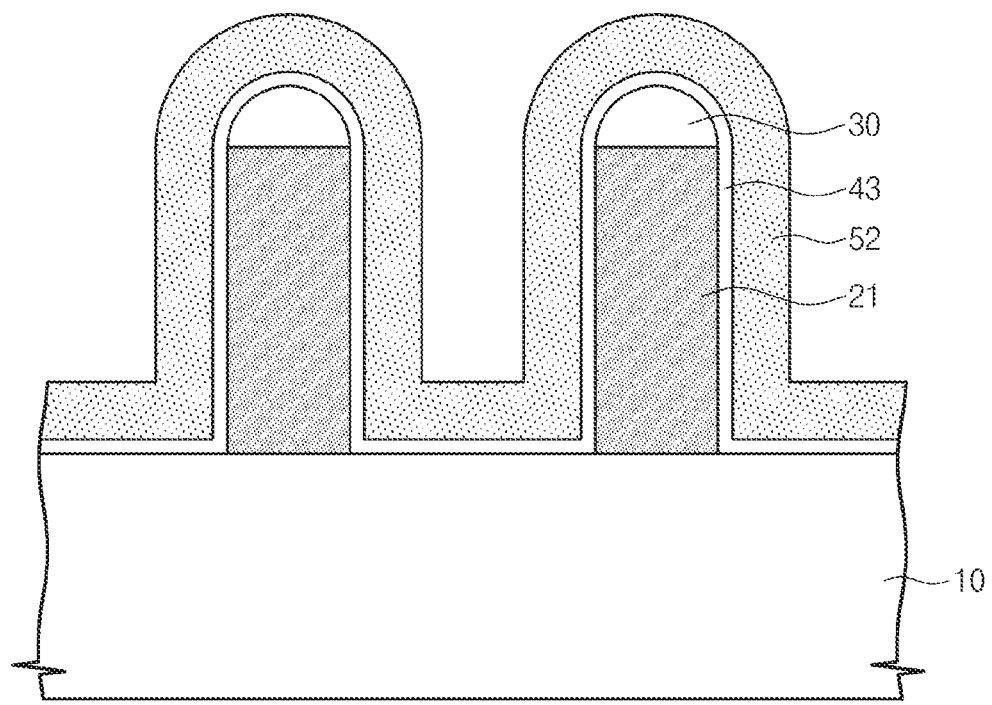
FIGS. 10 and 11 are cross-sectional views of a semiconductor device during the course of its manufacture and together illustrate a hydrophilic process according to the inventive concepts.
Figure 11:
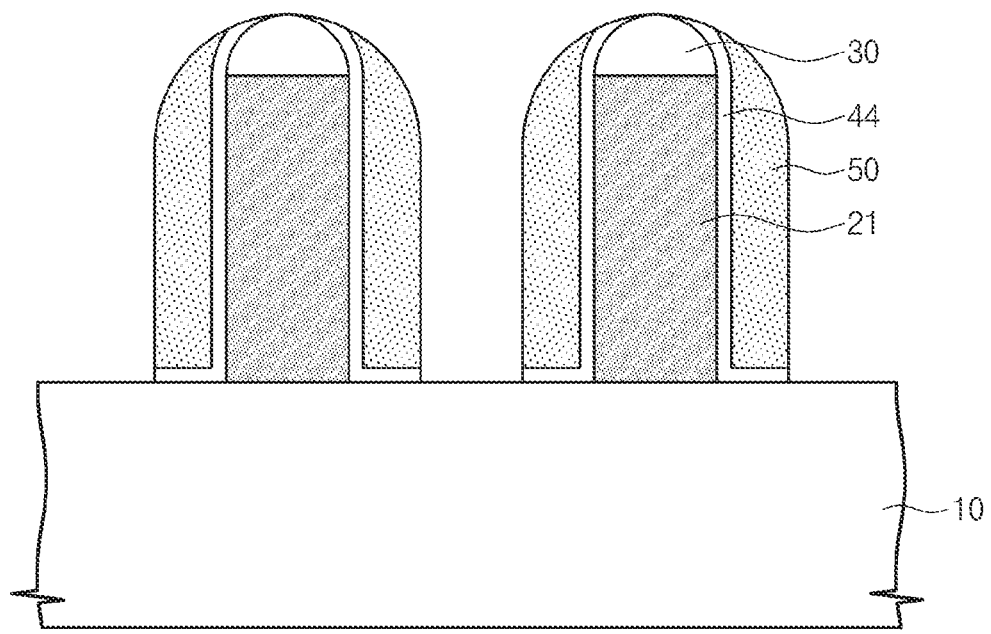

FIGS. 10 and 11 are cross-sectional views illustrating still other examples of the hydrophilic process according to the inventive concepts.

Referring to FIG. 10, a hydrophilic material may be formed on the side surfaces of the carbon-containing patterns 21 formed by the processes described with reference to FIGS. 1 and 2. In one example, an oxide layer 43 may be deposited on the etch target layer 10 on which the carbon-containing patterns 21 are formed. The oxide layer 43 may be conformally deposited on the side surfaces of the carbon-containing patterns 21, the top surfaces of the mask patterns 30, and an exposed top surface of the etch target layer 10. For example, the oxide layer 43 may include at least one of boron oxide and silicon-boron oxide. A poly-crystalline silicon layer 52 may be formed on the oxide layer 43. Hereinafter, a method of forming the oxide layer 43 and the poly-crystalline silicon layer 52 will be described in more detail with reference to FIGS. 12 to 14.

Referring to FIG. 11, an anisotropic etching process may be performed to expose the mask patterns 30. Thus, the oxide layer 43 may be formed into oxide patterns 44 that are disposed on both side surfaces of each of the carbon-containing patterns 21 so as to be separated from each other, and the poly-crystalline silicon layer 52 may be formed into poly-crystalline silicon spacers 50 which are disposed on both side surfaces of each of the carbon-containing patterns 21 so as to be separated from each other. In this example, the oxide layer 43 and the poly-crystalline silicon layer 52 are formed in-situ in the same process chamber of a deposition apparatus. Subsequently, the processes described with reference to FIG. 4 may be performed.

Figure 12:
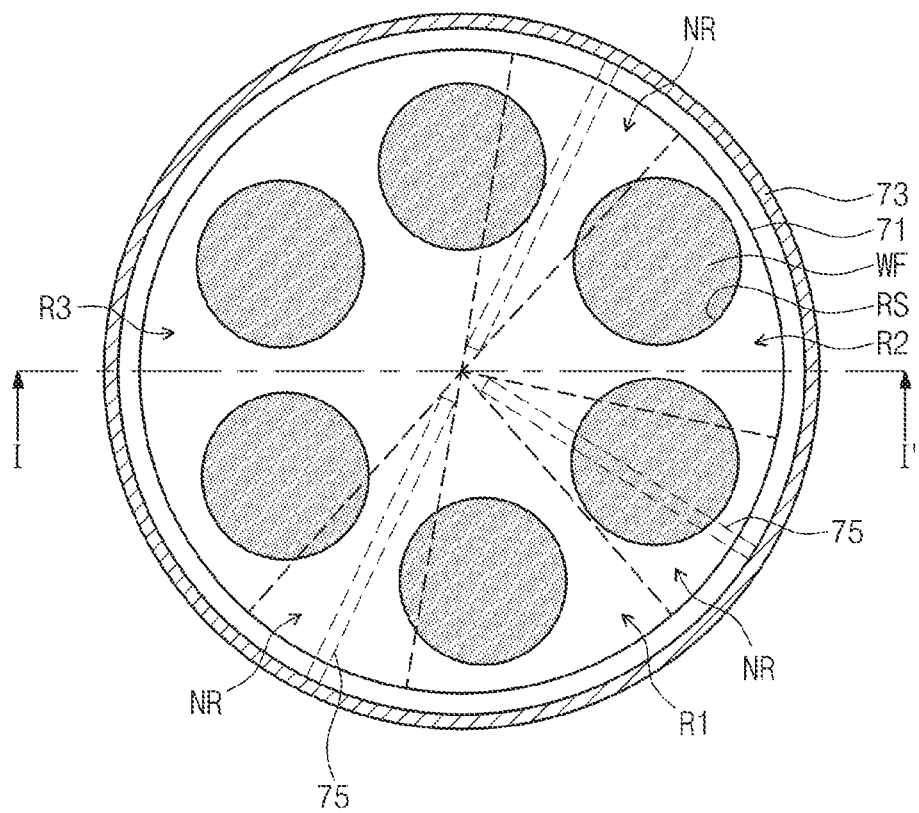
FIG. 12 is a plan view of an example of a deposition apparatus for forming an oxide layer and a poly-crystalline silicon layer according to the inventive concepts.
Figure 13:
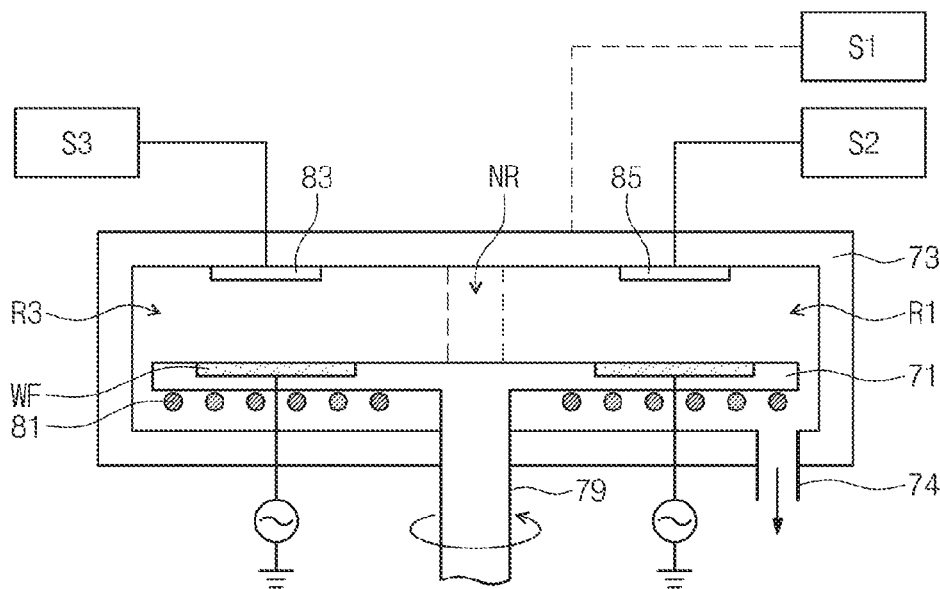
FIG. 13 is a cross-sectional view taken along a line I-I' of FIG. 12.

FIG. 12 is a plan view illustrating one example of a deposition apparatus for forming an oxide layer and a poly-crystalline silicon layer according to the inventive concepts. FIG. 13 is a cross-sectional view taken along line I-I' of FIG. 12.

The deposition apparatus may be an atomic layer deposition (ALD) apparatus. The deposition may include a process chamber 73, a susceptor 71 provided in the process chamber 73 to support wafers WF, and a chuck 79 driven by a rotary output of a motor and to which the susceptor 71 is connected so that the susceptor 71 can be rotated. The susceptor 71 may include recesses RS in which the wafers WF are safely placed. RF biases may be applied to portions of the susceptor 71 accommodating the wafers WF, respectively. The RF biases applied to the portions of the susceptor 71 may be controlled independently of each other. Heaters 81 may be provided under the susceptor 71 to heat the wafers WF, respectively.

The interior of the process chamber 73 may include a plurality of process regions R1 to R3 separated from each other by radial partitions NR. In other words, the wafers WF provided in the susceptor 71 may pass through the plurality of process regions R1 to R3 by rotating the susceptor about an axis of rotation of the output 79.

In one example, each of the partitions NR may be an inert gas curtain. In this case, the inert gas may be injected from a top plate of the process chamber 73 toward the susceptor 71 at high temperature to separate the plurality of process regions R1 to R3 from each other. For example, the inert gas may include nitrogen ($N_2$). In one example, nozzles 75 capable of injecting the inert gas toward the susceptor 71 may be provided in the top plate of the process chamber 73. The plurality of process chambers R1 to R3 may include a first region R1 into which a boron source is supplied, a second region R2 into which a silicon source is supplied, and a third region R3 into which an oxygen source is supplied. The wafers WF may repeatedly pass through the first to third regions R1 to R3 by the rotation of the susceptor 71.

The deposition apparatus may include an injection orifice (not shown) by which boron supplied through the top plate of the process chamber 73 from boron source S1 is injected into the first region R1 of the process chamber. The boron source S1 may comprise a source of $B_2H_6$. Boron atoms provided in the first region R1 from the boron source S1 may be adsorbed on a top surface of a wafer WF. The deposition apparatus may also include an injection orifice 85 by which silicon supplied through the top plate of the process chamber 73 from silicon source S2 is injected into the second region R2 of the process chamber. The silicon source S2 may comprise a source of silane. Silicon atoms provided in the second region R2 from the silicon source S2 may be adsorbed on a top surface of a wafer WF. The deposition apparatus may also include an injection orifice 83 by which oxygen supplied through the top plate of the process chamber 73 is injected into the third region R3 of the process chamber from oxygen source S3. The oxygen source S3 may comprise a source of $O_2$. Oxygen atoms injected into the third region R3 from the oxygen source S3 may be adsorbed on a top surface of a wafer WF.

The sources S1 to S3 may constitute a gas supply system, i.e., may comprise vessels that contain or generate the respective gases, or at least one of the sources S1 to S3 may constitute a plasma generator that supplies the respective gas in a plasma state. In the case of the latter, the plasma generator may include an RF source for forming plasma and provided in an upper part of the respective region of the process chamber 73. In one example, the silicon source S2 is a plasma generator that generates plasma from a gas comprising silicon, and comprises an RF source in an upper part of the second region R2 of the process chamber 73. Alternatively, the silicon source S2 may comprise a remote plasma generator.

The process chamber 73 may include an exhaust system, including an orifice 74, for forming a vacuum. Even though not shown in the drawings, the susceptor 71 may include exhaust orifices through which gases generated in the processes described above, respectively, are vented to the orifice 74 of the exhaust system.

In this example, oxygen from oxygen source S3 may be provided in a space separated from and/or at a time different from that/those in and/or at which the boron is supplied from boron source S1 and the silicon is supplied from silicon source S2. In an example of a process of forming an oxide layer according to the inventive concepts, boron, silicon and oxygen from the boron source S1, the silicon source S2, and the oxygen source S3 may be sequentially provided a plurality of times to each of the wafers WF to form a silicon-boron oxide layer. In another example of the process of forming the oxide layer, boron and oxygen from the boron source S1 and the oxygen source S3 may be provided and no silicon is provided from the silicon source S2. Thus, a boron oxide layer may be formed on the wafers WF.

Also in some examples, a cycle of providing the boron, silicon and oxygen from sources S1 to S3 is performed two to five times to form the oxide layer having a thickness of about 3 nm to about 7 nm. Subsequently, no oxygen is provided (from the oxygen source S3) while a cycle of providing boron and silicon from the boron source S1 and the silicon source S2 may is performed a plurality of times to form a poly-crystalline silicon layer including boron. The poly-crystalline silicon layer may be formed directly on the oxide layer and may have a thickness 20 or more times that of the oxide layer.

Figure 14:
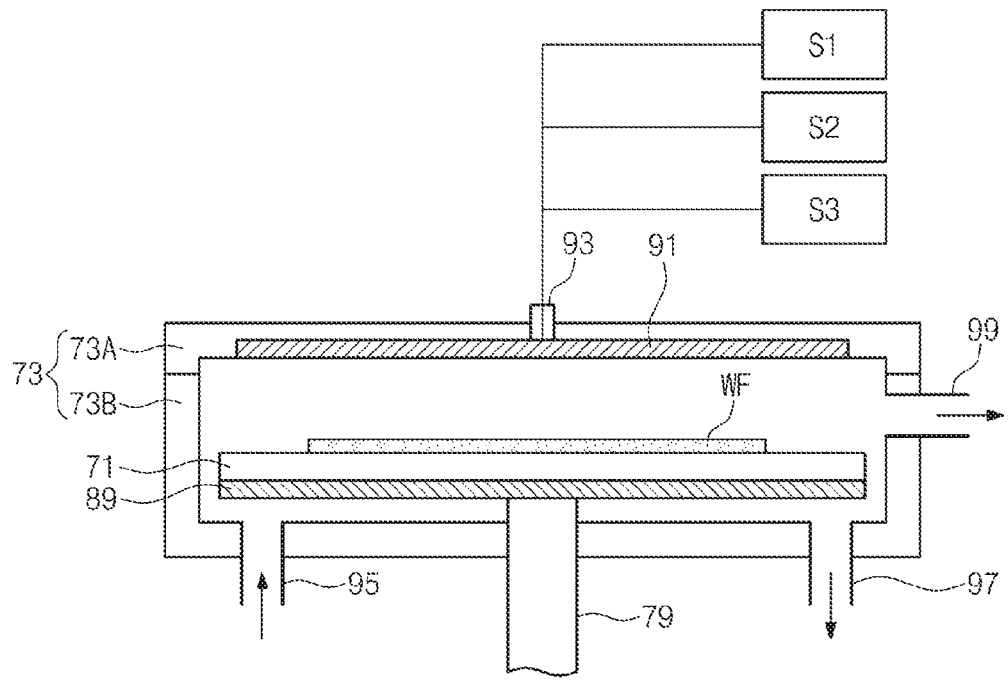
FIG. 14 is a cross-sectional view of another example of a deposition apparatus for forming an oxide layer and a poly-crystalline silicon layer according to the inventive concepts.

FIG. 14 illustrates another example of a deposition apparatus for forming an oxide layer and a poly-crystalline silicon layer according to the inventive concepts. The deposition apparatus of this example is a chemical vapor deposition (CVD) apparatus.

The deposition apparatus may include a process chamber 73, a susceptor 71 provided in the process chamber 73 and supporting a wafer WF, and a motor having a rotary output 79 connected to susceptor 71 to rotate the susceptor 71. Lift pins for supporting the wafer WF may be provided on the susceptor 71. A heater 89 for heating the wafer WF may be provided under the susceptor 71. In one example, the heater 89 includes a plate-shaped metal plate bonded to a bottom surface of the susceptor 71.

The process chamber 73 may include a lower portion 73B supporting the susceptor 71 and an upper portion 73A coupled to the lower portion 73B. An inlet 93 and a shower head 91 may be provided in the upper portion 73A of the process chamber 73. A plurality of sources of elements used in the deposition process (described below) may be connected to the inlet 93, and the shower head 91 may be connected to the inlet 93 to supply sources of these elements into the process chamber 73. An inlet 95 and an outlet 97 used for inflow and outflow of an inert gas may be provided in the lower portion 73B of the process chamber 73. An exhaust orifice 99 may be provided in a sidewall of the lower portion 73B.

In this example, the apparatus may provide at least two of boron, oxygen and silicon from a boron source S1, a silicon source S2 and an oxygen source S3 at the same time. The boron, silicon and oxygen mixed with each other may flow into the process chamber 73 through the shower head 91 in a process of forming an oxide layer. Thus, a silicon-boron oxide layer may be formed on the wafer WF. Alternatively, the boron and the oxygen may be supplied from the boron source S1 and the oxygen source S3 while silicon is withheld from the silicon source S2. Thus, a boron oxide layer may be formed on the wafer WF. In one example, the oxide layer may be formed to a thickness of about 3 nm to about 7 nm. Subsequently, oxygen may be withheld by the oxygen source S3 while boron and silicon are supplied from the boron source S1 and the silicon source S2, mix with each other and flow into the process chamber 73 to form a poly-crystalline silicon layer including boron on the oxide layer. The poly-crystalline silicon layer may be formed to a thickness 20 or more times that of the oxide layer.

Processes shown in and described with reference to FIGS. 5 and 6, FIGS. 7 to 9, and FIGS. 10 to 14 may be combined with each other. For example, a process shown in and described with reference to FIGS. 5 and 6 or FIGS. 10 to 14 may be additionally performed after the process shown in and described with reference to FIGS. 7 to 9 is performed. Alternatively, a process shown in and described with reference to FIGS. 10 to 14 may be additionally performed after a process shown in and described with reference to FIGS. 5 and 6 is performed.

Figure 15:
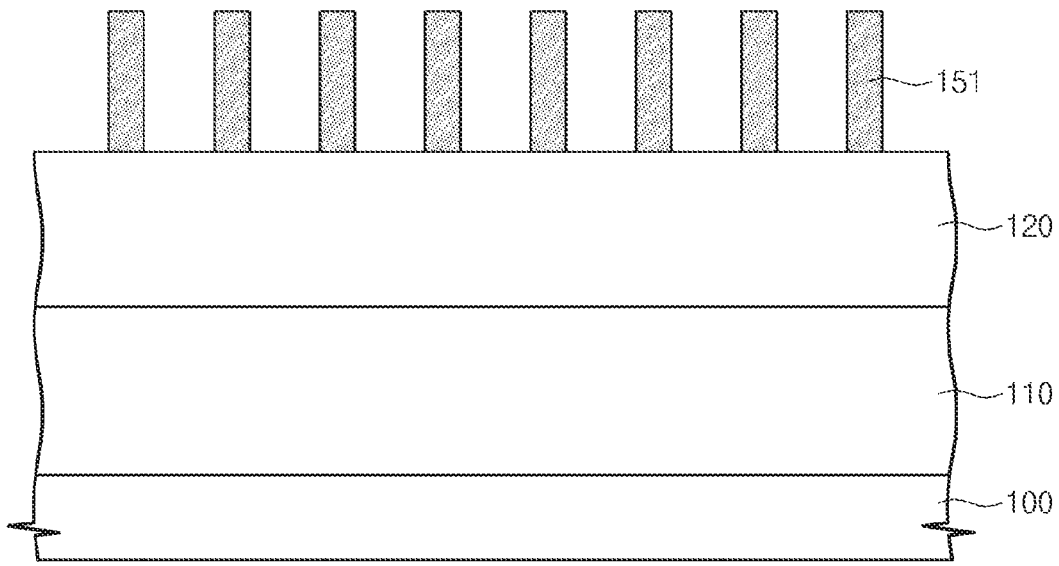
FIGS. 15, 16 and 17 are cross-sectional views of a semiconductor device during the course of its manufacture and together illustrate a method of patterning an etch target layer according to the inventive concepts.
Figure 16:
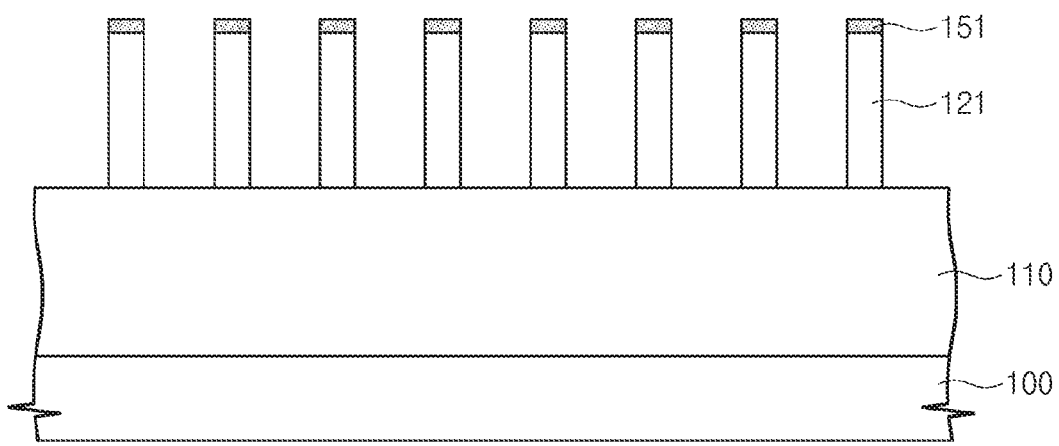
Figure 17:
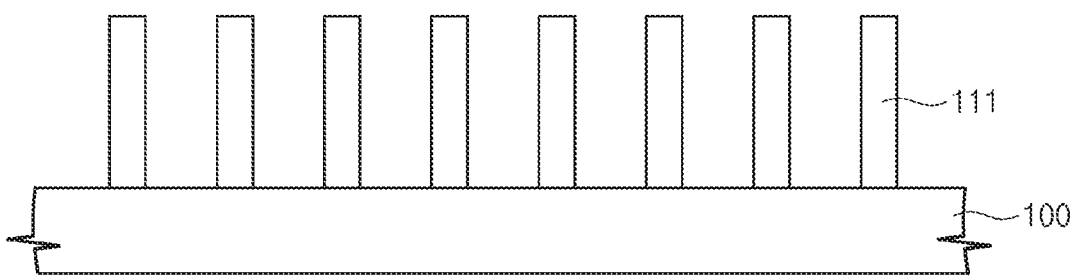

FIGS. 15 to 17 illustrate a method of patterning an etch target layer according to the inventive concepts.

Referring to FIG. 15, an etch target layer 110, an intermediate mask layer 120, and poly-crystalline silicon patterns 151 may be formed on a substrate 100. The etch target layer 110 may be a portion of the substrate 100 or an additional layer formed on the substrate 100. In the case in which the etch target layer 110 is a portion of the substrate 100, the etch target layer 110 may include silicon, silicon-germanium, or germanium. In the case in which the etch target layer 110 is an additional layer formed on the substrate 100, the etch target layer 110 may be an insulating layer including at least one of silicon oxide, silicon oxynitride and silicon nitride or may be a layer including a metal or a semiconductor material.

The intermediate mask layer 120 may include a material having an etch selectivity with respect to the poly-crystalline silicon patterns 151. For example, the intermediate mask layer 120 may include at least one of silicon oxide, silicon nitride, and silicon oxynitride. The intermediate mask layer 120 may be formed by a CVD process. The poly-crystalline silicon patterns 151 may be formed on the intermediate mask layer 120 by the substantially same method as the poly-crystalline silicon spacers 50 described with reference to FIGS. 1 to 4. In one example, the poly-crystalline silicon patterns 151 may have line shapes that are spaced apart from each other by substantially equal distances.

Referring to FIG. 16, the intermediate mask layer 120 may be etched using the poly-crystalline silicon patterns 151 as an etch mask to form intermediate mask patterns 121. At least a portion of the poly-crystalline silicon patterns 151 may be removed by the etching process. The etching process may be a dry etching process. In one example, the poly-crystalline silicon patterns 151 are removed.

Referring to FIG. 17, the etch target layer 110 may be patterned using the intermediate mask patterns 121 as an etch mask to form final patterns 111. The patterning process may be performed using at least one of various methods or various etchants in accordance with a material of the etch target layer 110. In one example, the patterning process may be performed by a dry etching process using oxygen plasma.

FIGS. 18 to 21 illustrate another example of a method of patterning an etch target layer according to the inventive concepts.

Figure 18:
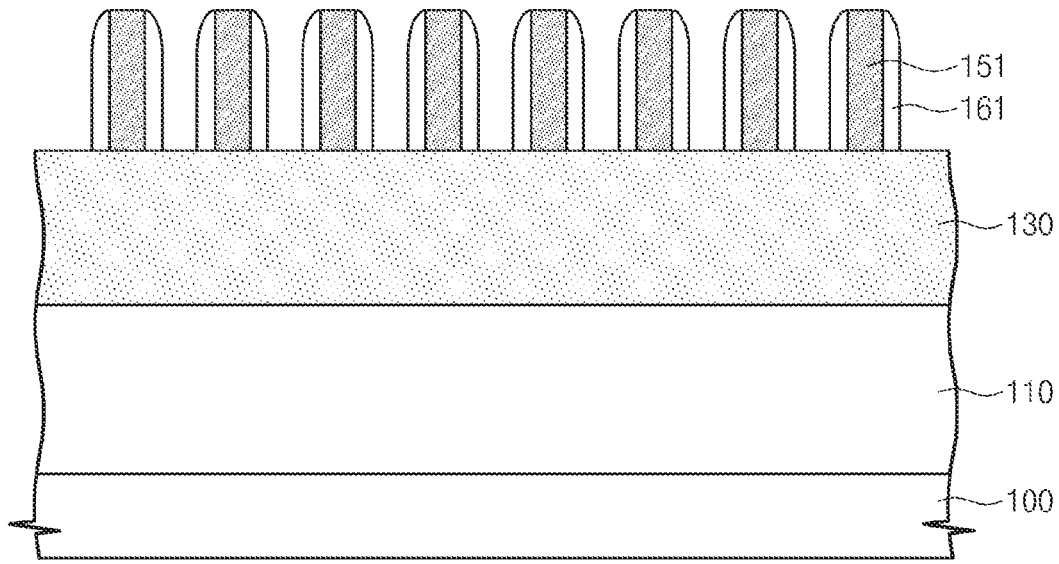
FIGS. 18, 19, 20 and 21 are cross-sectional views of a semiconductor device during the course of its manufacture and together illustrate a method for patterning an etch target layer according to the inventive concepts.

Referring to FIG. 18, an etch target layer 110, an intermediate mask layer 130, and poly-crystalline silicon patterns 151 may be formed on a substrate 100. The etch target layer 110 may be a portion of the substrate 100 or an additional layer formed on the substrate 100. In the case in which the etch target layer 110 is a portion of the substrate 100, the etch target layer 110 may include silicon, silicon-germanium, or germanium. In the case in which the etch target layer 110 is an additional layer formed on the substrate 100, the etch target layer 110 may be an insulating layer including at least one of silicon oxide, silicon oxynitride and silicon nitride or may be a layer including a metal or a semiconductor material.

The intermediate mask layer 130 may include a material having an etch selectivity with respect to the poly-crystalline silicon patterns 151. For example, the intermediate mask layer 130 may include at least one of silicon oxide, silicon nitride, and silicon oxynitride. The intermediate mask layer 130 may be formed by a CVD process. The poly-crystalline silicon patterns 151 may be formed on the intermediate mask layer 130 by substantially same method as the poly-crystalline silicon spacers 50 described with reference to FIGS. 1 to 4. In one example, the poly-crystalline silicon patterns 151 may have line shapes that are spaced apart from each by substantially equal distances.

Spacer patterns 161 may be formed on side surfaces of the poly-crystalline silicon patterns 151. An insulating layer may be conformally formed on the intermediate mask layer 130 on which the poly-crystalline silicon patterns 151 are formed, and then an anisotropic etching process may be performed on the insulating layer to form the spacer patterns 161. For example, the spacer patterns 161 may include at least one of silicon oxide, silicon nitride, and silicon oxynitride. A distance between the spacer patterns 161 may be smaller than a distance between the poly-crystalline silicon patterns 151. As a result, final patterns to be described below may be finer than the poly-crystalline silicon patterns 151.

Figure 19:
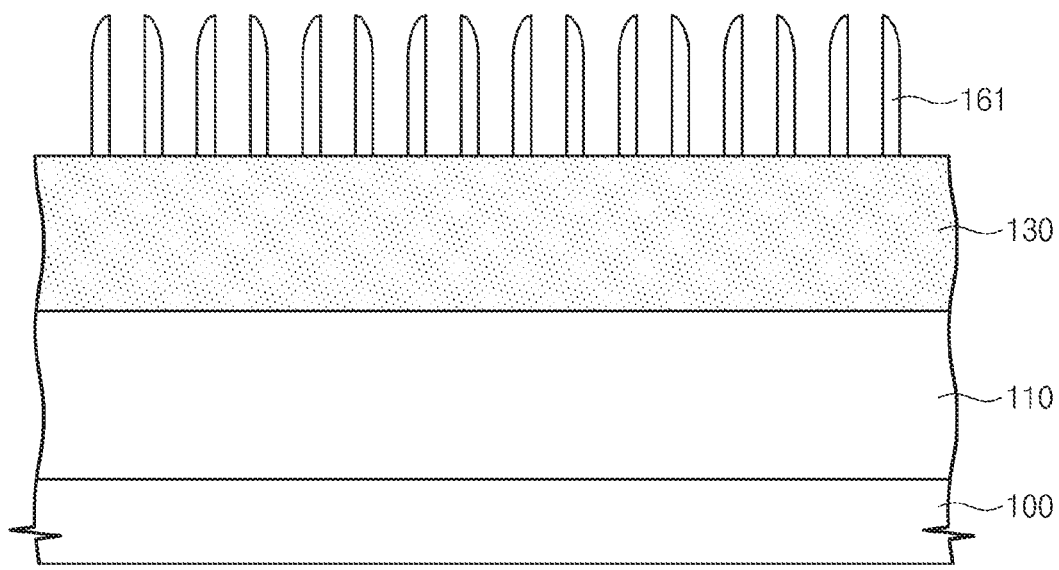
Figure 20:
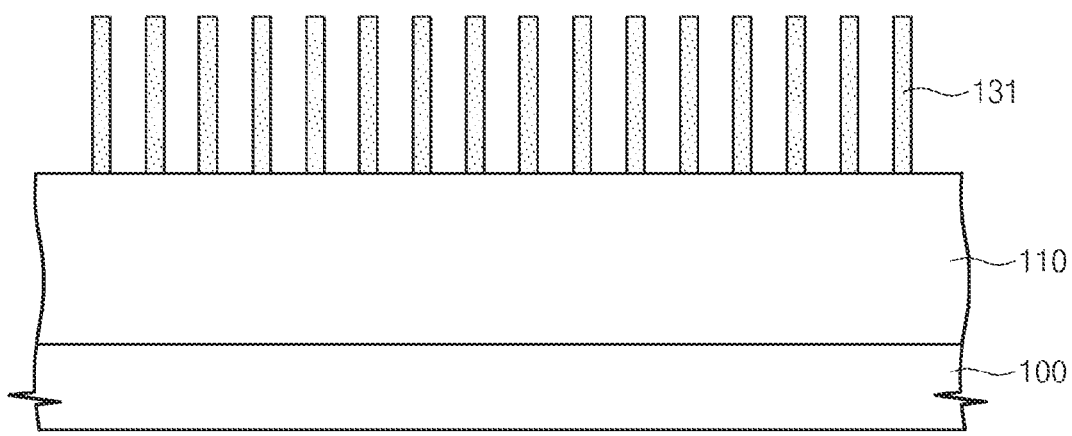

Referring to FIG. 19, the poly-crystalline silicon patterns 151 may be selectively removed to expose a top surface of the intermediate mask layer 130 between the spacer patterns 161. The process of removing the poly-crystalline silicon patterns 151 may include an ashing process using oxygen. The distance between the spacer patterns 161 may be smaller than the distance between the poly-crystalline silicon patterns 151 as described above, so fine patterns may be formed. The distances between the spacer patterns 161 may be substantially equal to each other. However, the inventive concepts are not limited thereto. The distances and shapes of the spacer patterns 161 may be variously controlled to form desired patterns.

The intermediate mask layer 130 may be etched using the spacer patterns 161 as an etch mask to form intermediate mask patterns 131. At least a portion of the spacer patterns 161 may be removed by the etching process performed on the intermediate mask layer 130. The etching process may be a dry etching process. In one example, the spacer patterns 161 may be removed.

Figure 21:
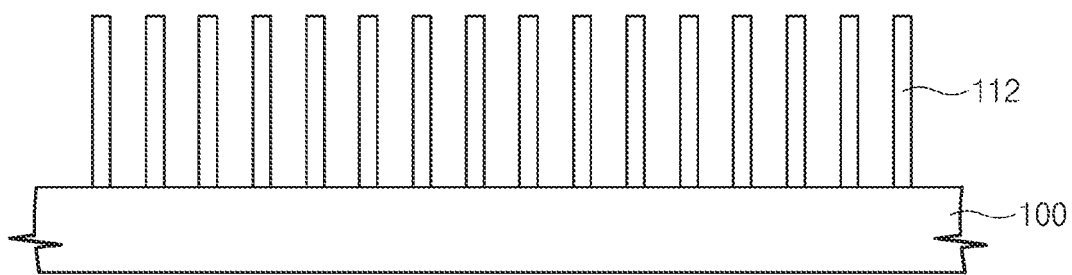

Referring to FIG. 21, the etch target layer 110 may be patterned using the intermediate mask patterns 131 as an etch mask to form final patterns 112. The patterning process may be performed using at least one of various methods or various etchants in accordance with a material of the etch target layer 110. In one example, the patterning process may be performed by a dry etching process using oxygen plasma.

Figure 22:
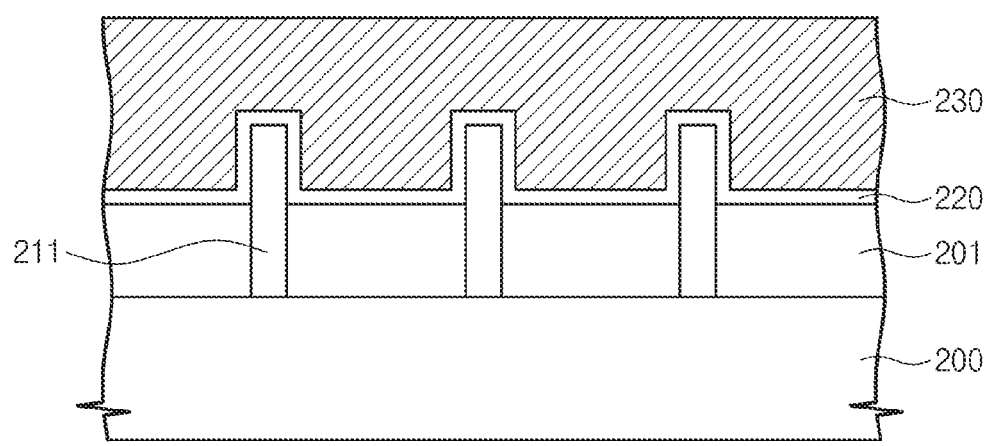
FIG. 22 is a cross-sectional view of a semiconductor device including patterns formed according to the inventive concepts.

FIG. 22 illustrates a semiconductor device formed according to the inventive concepts.

Referring to FIG. 22, the semiconductor device may be a fin field effect transistor (fin FET) that includes fins 211 corresponding to the final patterns formed according to the inventive concepts. The fins 211 may constitute an active region of the fin FET.

The fins 211 may be formed using an upper portion of a substrate 200 as a final etch target layer or using an additional semiconductor layer formed on the substrate 200 as the final etch target layer. For example, the fins 211 may include silicon, silicon-germanium, or germanium. The fins 211 may have line shapes extending in one direction.

A gate insulating layer 220 and a gate electrode 230 may be sequentially provided on the fins 211. The gate insulating layer 220 may include at least one of a silicon oxide layer and a high-k dielectric layer having a dielectric constant higher than that of the silicon oxide layer. The gate electrode 230 may include at least one of a metal, a conductive metal nitride, and a doped semiconductor.

Methods according to the inventive concepts are not limited to the manufacturing of the fin FET described above but can be applied to the manufacturing of various other forms of semiconductor device patterned structures.

Figure 23:
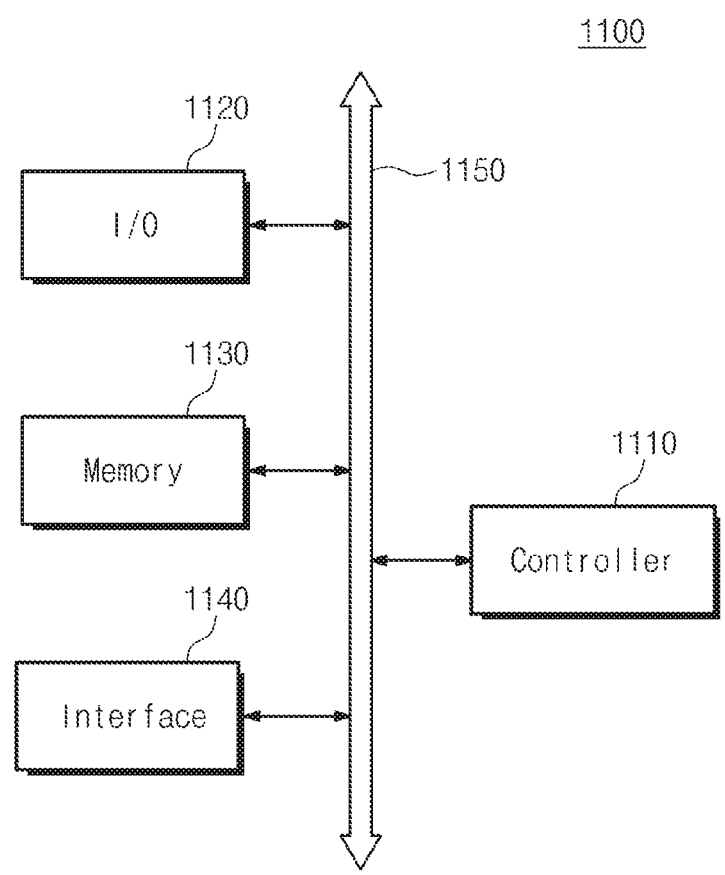
FIG. 23 is a schematic block diagram of an electronic system including a semiconductor device manufactured according to the inventive concepts.

FIG. 23 is a schematic block diagram of one example of an electronic system including a semiconductor device manufactured according to the inventive concepts.

Referring to FIG. 23, electronic system 1100 may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include a semiconductor device manufactured according to the inventive concepts.

The controller 1110 may include at least one of a microprocessor, a digital signal processor, a microcontroller, and the like. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 24:
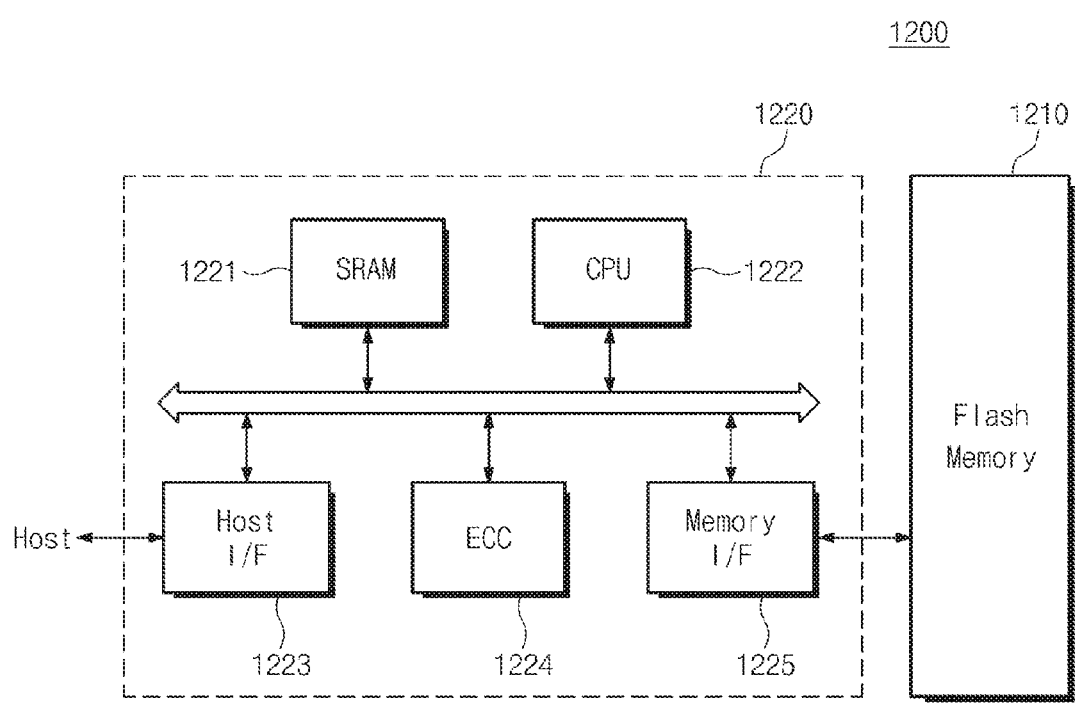
FIG. 24 is a schematic block diagram of a memory card including a semiconductor device manufactured according to the inventive concepts.

FIG. 24 is a schematic block diagram of one example of a memory card including a semiconductor device manufactured according to the inventive concepts.

Referring to FIG. 24, memory card 1200 may include a memory device 1210. The memory device 1210 may include at least one semiconductor device manufactured by one of the methods described above. In addition, the memory device 1210 may further include another type of semiconductor memory device or devices (e.g., a DRAM device and/or an SRAM device). The memory card 1200 may include a memory controller 1220 that controls data communication between a host and the memory device 1210. The memory device 1210 and/or the memory controller 1220 may include at least one semiconductor device manufactured according to the inventive concepts.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may be configured to provide a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code to interface with the host. The memory card 1200 may be used as a portable data storage card. Alternatively, the memory card 1200 may be realized as a solid state drive (SSD) which used as a hard drive of a computer system.

Figure 25:
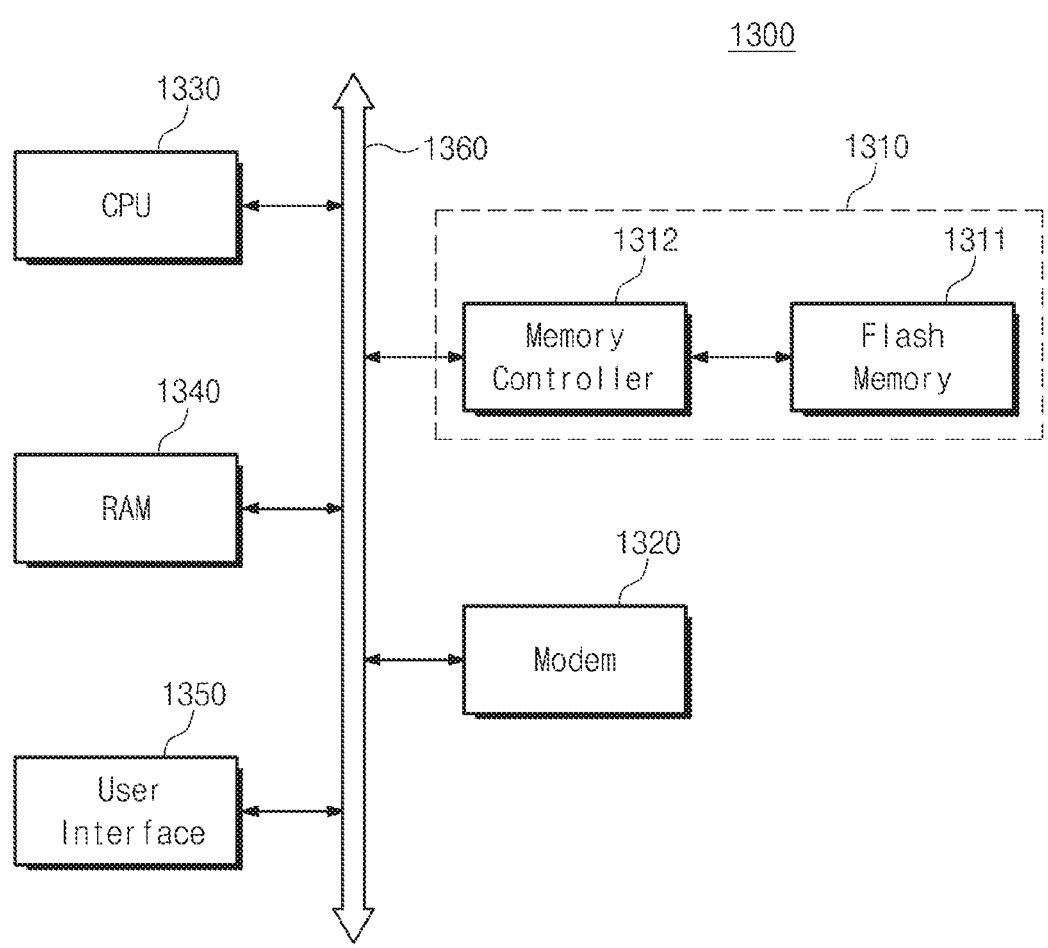
FIG. 25 is a schematic block diagram of an information processing system including a semiconductor device manufactured according to the inventive concepts.

FIG. 25 is a schematic block diagram of one example of an information processing system including a semiconductor device manufactured according to the inventive concepts.

Referring to FIG. 25, flash memory system 1310 may be provided as a component of an information processing system such as a mobile device or a desk top computer. An information processing system 1300 may include a modem 1320, a CPU 1330, a RAM 1340 and a user interface unit 1350 which are electrically connected to the flash memory system 1310 through a system bus 1360. The flash memory system 1310 may have the substantially same structure as the memory card described above. In other words, the flash memory system 1310 may include a memory device 1311 and a memory controller 1312. The flash memory system 1310 may store data processed by the CPU 1330 or data inputted from an external system. In one example, the flash memory system 1310 may be realized as a solid state drive (SSD). In this case, the information processing system 1300 may stably store a massive amount of data in the flash memory system 1310. In addition, as reliability of the flash memory system 1310 is improved, the flash memory system 1310 may reduce a resource consumed for correcting errors. Thus, the information processing system 1300 may have a fast operating data communication function. Even though not shown in the drawings, the information processing system 1300 may further include an application chipset, a camera image processor (CIS), and/or an input/output (I/O) unit.

The semiconductor devices and/or the memory card described above may be encapsulated using various packaging techniques. For example, the semiconductor devices and/or the memory card according to the aforementioned examples may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The manufacturing of semiconductor devices includes a patterning process according to the inventive concepts that is relatively easy to perform. In addition, the patterns formed in a method of manufacturing a semiconductor device according to the inventive concept may be minute, fine and accurately formed, i.e., may have a CD (critical dimension) substantially the same as the specified CD.

Although the inventive concepts have been described with reference to various examples, it will be apparent to those skilled in the art that various changes and modifications may be made to these examples without departing from the spirits and scope of the inventive concepts. Therefore, it should be understood that the above-described examples are not limiting, but illustrative of the inventive concepts. Thus, all such changes and modifications are seen to be within the true spirit and scope of the inventive concepts as defined by the following claims.

What is claimed is:
1. A method of manufacturing a semiconductor device, the method comprising:
    forming carbon-containing patterns on an etch target;
    increasing a degree to which side surfaces of the carbon-containing patterns are hydrophilic by treating the carbon-containing patterns with a hydrophilic-enhancing process;

forming poly-crystalline silicon spacers on the side surfaces of the carbon-containing patterns after the hydrophilic-enhancing process; and patterning the etch target using the poly-crystalline silicon spacers.

2. The method of claim 1, wherein the hydrophilic-enhancing process comprises: forming an oxide layer on the side surfaces of the carbon-containing patterns.

3. The method of claim 1, wherein the poly-crystalline silicon spacers are formed at 400 degrees Celsius or less.

4. The method of claim 3, wherein the poly-crystalline silicon spacers include boron (B) atoms.

5. The method of claim 1, wherein forming the carbon-containing patterns comprises:

forming a silicon-containing layer on a carbon-containing layer; and etching the carbon-containing layer using the silicon-containing layer as an etch mask.

6. The method of claim 5, wherein etching the carbon-containing layer comprises: performing a dry etching process using oxygen plasma, and wherein silicon atoms in the silicon-containing layer are combined with oxygen atoms in the oxygen plasma to form an oxide layer on the side surfaces of the carbon-containing patterns while the carbon-containing layer is etched.

7. The method of claim 5, wherein the silicon-containing layer includes at least one of $SiO_2$, SiON, $SiN_2$, SiBN, SiCN, and silicon-spin on hardmask (Si—SOH).

8. The method of claim 1, wherein surfaces of the carbon-containing patterns terminate with first elements, and wherein the hydrophilic-enhancing process comprises: replacing at least some of the first elements with second elements that are more hydrophilic than the first elements.

9. The method of claim 8, wherein the second elements constitute material that has negative polarity or has electronegativity greater than that of the material constituted by the first elements.

10. The method of claim 8, wherein the first elements include C or H, and wherein the material constituted by the second elements consists of at least one of O, ON, OH, N, and NH.

11. The method of claim 8, wherein the hydrophilic-enhancing process comprises: performing a wet treatment process using $O_3$ or a wet treatment process using $NH_4OH$ and $H_2O_2$.

12. The method of claim 1, wherein patterning the etch target using the poly-crystalline silicon spacers comprises:

forming a mask layer on the etch target before the polycrystalline silicon spacers are formed so that the mask layer is interposed between the etch target and the poly-crystalline silicon spacers;

etching the mask layer using the poly-crystalline silicon spacers as an etch mask to form mask patterns; and etching the etch target using the mask patterns as an etch mask.

13. The method of claim 1, wherein patterning the etch target using the poly-crystalline silicon spacers comprises:

forming spacer patterns on side surfaces of the poly-crystalline silicon spacers; and removing the poly-crystalline silicon spacers.

14. The method of claim 1, wherein the carbon-containing patterns contain carbon in an amount equal to or greater than 70 wt %.

15. The method of claim 14, wherein the forming of the carbon-containing patterns includes forming at least one of an amorphous carbon layer and a carbon-spin on hardmask (C—SOH) on the etch target.

16. A method of manufacturing a semiconductor device, the method comprising:

forming carbon-containing patterns on an etch target, the carbon-containing patterns having top surfaces and side surfaces;

providing second material, that is more hydrophilic than first material constituting the side surfaces of the carbon-containing patterns terminate, along the side surfaces of the carbon-containing patterns so that the side surfaces become more hydrophilic;

forming poly-crystalline silicon spacers on the side surfaces of the carbon-containing patterns provided with the second material; and patterning the etch target layer using the poly-crystalline silicon spacers.

17. The method of claim 16, wherein the hydrophilic material includes silicon oxide.

18. The method of claim 16, wherein the patterning of the etch target layer using the poly-crystalline silicon spacers comprises:

forming spacer patterns on side surfaces of the poly-crystalline silicon spacers, subsequently removing the poly-crystalline silicon spacers, and patterning the etch target layer using the spacer patterns.

19. The method of claim 16, wherein the poly-crystalline silicon spacers include boron (B) atoms, and the poly-crystalline silicon spacers are formed at 400 degrees Celsius or less.

20. A method of manufacturing a semiconductor device, the method comprising:

forming on an etch target a series of spaced apart carbon-containing patterns having side surfaces;

forming insulating material of at least one element and/or at least one compound selected from the group consisting of O, ON, OH, N and NH at the side surfaces of the carbon-containing patterns;

forming a mask; and etching the etch target using the mask as an etch mask, and wherein the forming of the mask comprises forming polycrystalline silicon on the insulating material including by a process in which atoms of silicon are deposited directly on the insulating material, and removing the carbon-containing patterns after the poly-crystalline silicon has been formed on the insulating material.

* * * * *